(12) United States Patent
Kronholz et al.

(10) Patent No.: US 8,173,501 B2
(45) Date of Patent: May 8, 2012

(54) REDUCED STI TOPOGRAPHY IN HIGH-K METAL GATE TRANSISTORS BY USING A MASK AFTER CHANNEL SEMICONDUCTOR ALLOY DEPOSITION

(75) Inventors: Stephan Kronholz, Dresden (DE); Markus Lenski, Dresden (DE); Richard Carter, Dresden (DE)

(73) Assignee: Globalfoundries Inc., Grand Cayman (KY)

( * ) Notice: Subject to any disclaimer, the term of this patent is extended or adjusted under 35 U.S.C. 154(b) by 0 days.

(21) Appl. No.: 12/964,136

(22) Filed: Dec. 9, 2010

(65) Prior Publication Data

US 2011/0269277 A1 Nov. 3, 2011

(30) Foreign Application Priority Data

Apr. 30, 2010 (DE) .......................... 10 2010 028 459

(51) Int. Cl.
*H01L 21/8238* (2006.01)
(52) U.S. Cl. .................. 438/218; 257/E21.632
(58) Field of Classification Search .................. 438/218, 438/199, 238; 257/E21.632
See application file for complete search history.

(56) References Cited

U.S. PATENT DOCUMENTS

| | | | | |
|---|---|---|---|---|
| 5,268,324 A | * | 12/1993 | Aitken et al. ................. | 438/217 |
| 6,831,020 B2 | * | 12/2004 | Yamada et al. ............... | 438/770 |
| 7,282,402 B2 | * | 10/2007 | Sadaka et al. ................. | 438/221 |
| 7,445,981 B1 | * | 11/2008 | Karve et al. ................... | 438/199 |
| 7,579,262 B2 | * | 8/2009 | Hoentschel et al. .......... | 438/478 |
| 2002/0052075 A1 | | 5/2002 | Noda | |
| 2006/0068557 A1 | * | 3/2006 | Ochimizu et al. ............ | 438/312 |
| 2006/0131652 A1 | * | 6/2006 | Li ................................. | 257/350 |
| 2008/0079086 A1 | * | 4/2008 | Jung et al. ..................... | 257/369 |
| 2008/0099794 A1 | * | 5/2008 | Beyer et al. ................... | 257/255 |
| 2008/0203432 A1 | * | 8/2008 | Kim .............................. | 257/192 |
| 2010/0193881 A1 | * | 8/2010 | Kronholz et al. ............. | 257/402 |
| 2010/0301409 A1 | * | 12/2010 | Breitwisch et al. .......... | 257/331 |

FOREIGN PATENT DOCUMENTS

DE 10 2006 015 090 A1 10/2007

OTHER PUBLICATIONS

Translation of Official Communication from German Patent Application No. 10 2010 028 459.9 dated Dec. 29, 2010.

* cited by examiner

*Primary Examiner* — William D Coleman
*Assistant Examiner* — Christine Enad
(74) *Attorney, Agent, or Firm* — Williams, Morgan & Amerson, P.C.

(57) ABSTRACT

In a manufacturing strategy for providing high-k metal gate electrode structures in an early manufacturing stage, process-related non-uniformities during and after the patterning of the gate electrode structures may be reduced by providing a superior surface topography. To this end, the material loss in the isolation region may generally be reduced and a more symmetrical exposure to reactive etch atmospheres during the subsequent removal of the growth mask may be accomplished by providing an additional etch mask when removing the growth mask from the active regions of N-channel transistors, after the growth of the threshold adjusting semiconductor material on the active regions of the P-channel transistors.

16 Claims, 9 Drawing Sheets

REDUCED STI TOPOGRAPHY IN HIGH-K METAL GATE TRANSISTORS BY USING A MASK AFTER CHANNEL SEMICONDUCTOR ALLOY DEPOSITION

BACKGROUND OF THE INVENTION

1. Field of the Invention

Generally, the present disclosure relates to sophisticated integrated circuits including advanced transistor elements that comprise high-k metal gate electrode structures formed in an early manufacturing stage.

2. Description of the Related Art

The fabrication of advanced integrated circuits, such as CPUs, storage devices, ASICs (application specific integrated circuits) and the like, requires a large number of circuit elements to be formed on a given chip area according to a specified circuit layout, wherein field effect transistors represent one important type of circuit element that determines performance of the integrated circuits. Generally, a plurality of process technologies are currently practiced, wherein, for many types of complex circuitry, including field effect transistors, CMOS technology is currently one of the most promising approaches due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and reduction of gate resistivity, is a dominant design criterion for accomplishing an increase in the operating speed of the integrated circuits.

Presently, the vast majority of integrated circuits are fabricated on the basis of silicon due to the substantially unlimited availability thereof, the well-understood characteristics of silicon and related materials and processes and the experience gathered over the last 50 years. Therefore, silicon will likely remain the material of choice in the foreseeable future for circuit generations designed for mass production. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide has been preferably used as a gate insulation layer that separates the gate electrode, frequently comprised of polysilicon, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current due to the required enhanced capacitive coupling of the gate electrode to the channel region that has typically been accomplished by decreasing the thickness of the silicon dioxide layer. For example, a channel length of approximately 0.08 μm may require a gate dielectric made of silicon dioxide as thin as approximately 1.2 nm. Although, generally, usage of high speed transistor elements having an extremely short channel may be restricted to high speed signal paths, whereas transistor elements with a longer channel may be used for less critical signal paths, the relatively high leakage current caused by direct tunneling of charge carriers through an ultrathin silicon dioxide gate insulation layer may reach values for an oxide thickness in the range of 1-2 nm that may no longer be compatible with requirements for many types of integrated circuits.

Therefore, replacing silicon dioxide, or at least a part thereof, as the material for gate insulation layers has been considered. Possible alternative dielectrics include materials that exhibit a significantly higher permittivity so that a physically greater thickness of a correspondingly formed gate insulation layer nevertheless provides a capacitive coupling that would be obtained by an extremely thin silicon dioxide layer. It has thus been suggested to replace silicon dioxide with high permittivity materials such as tantalum oxide, strontium titanium oxide, hafnium oxide, HfSiO, zirconium oxide and the like.

When advancing to sophisticated gate architectures based on high-k dielectrics, additionally, transistor performance may also be increased by providing an appropriate conductive material for the gate electrode to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance even at a less critical thickness compared to a silicon dioxide layer, while maintaining leakage currents at an acceptable level. On the other hand, a metal-containing non-polysilicon material, such as titanium nitride and the like, may be formed so as to directly connect to the high-k dielectric material, thereby substantially avoiding the presence of a depletion zone. Since the conventional mechanisms for adjusting the work function of the gate electrodes, and thus the threshold voltage of the transistors, by an appropriate doping of the polysilicon material are no longer available in high-k metal gate electrodes, an appropriate adjustment of the effective work function with respect to the conductivity type of the transistor under consideration has to be implemented in the process flow for forming the high-k metal gate electrode structures.

For example, appropriate metal-containing gate electrode materials such as titanium nitride and the like may frequently be used in combination with appropriate metal species, such as lanthanum, aluminum and the like, so as to adjust the work function to be appropriate for each type of transistor, i.e., N-channel transistors and P-channel transistors, which may require an additional band gap offset for the P-channel transistor. For this reason, it has been proposed to appropriately adjust the threshold voltage of transistor devices by providing a specifically designed semiconductor material at the interface between the high-k dielectric material and the channel region of the transistor device, in order to appropriately "adapt" the band gap of the specifically designed semiconductor material to the work function of the metal-containing gate electrode material, thereby obtaining the desired low threshold voltage of the transistor under consideration. Typically, a corresponding specifically designed semiconductor material, such as silicon/germanium and the like, may be provided by an epitaxial growth technique at an early manufacturing stage, which may also represent an additional complex process step, which, however, may avoid complex processes for adjusting the work function and thus the threshold voltages in a very advanced process stage, as is the case in so-called replacement gate approaches.

It turns out, however, that the manufacturing sequence for forming the threshold adjusting semiconductor alloy may have a significant influence on transistor characteristics caused by an asymmetry of the process history of active regions of P-channel transistors and N-channel transistors during the complex manufacturing sequence for patterning the gate electrode structures. As is well known, the patterning of sophisticated gate electrode structures having a gate length of 50 nm and less requires very sophisticated lithography and etch techniques in combination with sophisticated deposition processes for providing the materials of the gate electrode structure. During the lithography, the deposition and the subsequent patterning processes, the existing topography of the semiconductor device may have a significant influence and thus great efforts are made in order to provide a substantially planar surface in the active regions and the adjacent isolation regions, which are provided so as to laterally delineate the active regions. To this end, typically, the process sequence is designed such that, for any etch processes and cleaning processes which may have to be applied during and after the manufacturing processes for forming the shallow trench isolations, the material consumption in the active regions, and in particular in the shallow trench isolations, may result in substantially the same height level prior to performing the manufacturing sequence for fabricating the complex gate electrode structures. For this purpose, the various processes may be assessed in advance in terms of material consumption and the like, and, based on these results, appropriate process adaptations, for instance an initial extra height of the shallow trench isolation regions and the like, may be appropriately adjusted.

When forming high-k metal gate electrode structures in an early manufacturing stage, in addition to the sophisticated lithography and patterning processes, additional material layers may have to be provided with a thickness of several angstrom to several nanometers, which may also require a superior initial surface topography prior to a gate patterning process. Moreover, after completing the complex gate electrode structures, any sensitive materials of the complex gate stacks may have to be reliably encapsulated on the basis of a thin dielectric material, such as silicon nitride, wherein the efficiency of the confinement may also depend on any preceding patterning related non-uniformities.

Since the incorporation of a threshold adjusting semiconductor alloy in one of the active regions, for instance for the P-channel transistors, introduces a certain degree of asymmetry, an inferior surface topography may be created prior to the actual gate patterning process, as will be described in more detail with reference to FIGS. 1a-1i.

FIG. 1a schematically illustrates a cross-sectional view of a semiconductor device 100 comprising a substrate 101 above which is formed a silicon-based semiconductor material 102 having an appropriate thickness for forming therein and thereabove transistors. Furthermore, an isolation structure 102C in the form of a shallow trench isolation is formed in the semiconductor layer 102, thereby laterally delineating and thus defining size and position of active regions 102A, 102B. In this context, an active region is to be understood as a semiconductor material in which an appropriate dopant profile is formed or is to be generated in order to form PN junctions for one or more transistors. In the example shown in FIG. 1a, the active region 102A corresponds to a P-channel transistor, while the active region 102B represents an N-channel transistor. Hence, the active regions 102A, 102B comprise an appropriate basic dopant concentration in order to determine the conductivity type of a P-channel transistor and an N-channel transistor, respectively. It should be appreciated that the active regions 102A, 102B may comprise or may receive other material species, such as germanium, carbon and the like, in order to appropriately adjust the overall electronic characteristics. As discussed above, in the active region 102A, an appropriate valence band offset is to be adjusted with respect to a sophisticated gate electrode structure that is still to be formed. For this purpose, an appropriate semiconductor alloy will be provided in the active region 102A, as will be described later on in more detail.

The semiconductor device 100 as illustrated in FIG. 1a may be formed on the basis of the following conventional process strategies. First, the isolation structure 102C is formed by well-established lithography, etch, deposition and planarization techniques in which a trench is formed in the semiconductor layer 102 that is subsequently filled with a silicon dioxide material, for instance based on high density plasma chemical vapor deposition (CVD) and the like. After removing any excess material, the further processing is typically continued by performing a plurality of implantation processes using an appropriate masking regime in order to introduce the required dopant species for generating the basic dopant concentration in the active regions 102A, 102B so as to correspond to the type of transistor to be formed therein and thereabove. As explained above, the processes for forming the isolation structure 102C, the removal of any mask materials and the subsequent process sequence for incorporating the well dopant species may be designed such that a substantially planar surface topography is obtained with respect to the active regions 102A, 102B and the isolation region 102C. After activating the dopant species in the active regions 102A, 102B and re-crystallizing implantation-induced damage, the further processing is continued by exposing the device 100 to an oxidizing ambient 110, which is typically established on the basis of elevated temperatures, for instance in the range of 700-1200° C., and supplying oxygen in order to obtain a desired oxidation rate of the exposed surface areas of the active regions 102A, 102B. Thus, during the oxidation process 110, a mask layer 104 is formed in a well-controllable manner having a thickness of, for instance, 10 nm or less.

FIG. 1b schematically illustrates the semiconductor device 100 in a further advanced manufacturing stage in which an etch mask 105, such as a resist mask, is formed above the semiconductor device 100 such that the mask material 104 on the first active region 102A is exposed, together with a portion of the isolation region 102C, while the mask material 104 formed on the second active region 102B and an adjacent portion of the isolation region 102C are protected by the mask 105. The etch mask 105 is formed by well-established lithography techniques. Thereafter, an etch process is applied in order to selectively remove the mask material 104 from the first active region 102A, which is accomplished by using diluted hydrofluoric acid (HF), which allows a selective removal of silicon dioxide material while substantially not attacking silicon material. Consequently, during the etch process based on HF, the exposed portion of the trench isolation region 102C also suffers from a material loss.

FIG. 1c schematically illustrates the semiconductor device 100 after the selective removal of the mask material 104 and the removal of the etch mask 105 (FIG. 1b). As illustrated, due to the preceding etch process, a certain material loss has been created in the isolation structure 102C adjacent to the active region 102A, while the previously covered portion may have the initial height.

FIG. 1d schematically illustrates the semiconductor device 100 when exposed to a further reactive process ambient 106, which includes a cleaning process and the like in order to prepare the device 100 for the subsequent deposition of a silicon/germanium alloy selectively on the first active region 102A. The process 106 is typically established on the basis of any appropriate chemistry in order to remove contaminants and the like which may have been created during the previous removal of the etch mask and the like. Typically, the cleaning process 106 causes a certain degree of material erosion of the mask 104, thereby reducing a thickness thereof, as indicated by 104R, however, without actually exposing surface portions of the second active region 102B. Similarly, a certain material loss may occur in the isolation structure 102C, however, in a substantially identical manner adjacent to the active region 102A and adjacent to the active region 102B.

FIG. 1e schematically illustrates the semiconductor device 100 during a selective epitaxial growth process 107 in which process parameters, such as temperature, pressure, flow rates of precursor gases and the like, are appropriately selected such that a material deposition is substantially restricted to exposed silicon surface areas, while the dielectric surfaces may substantially prevent a deposition of material. Hence, during the process 107, a silicon/germanium material 108 is selectively formed in the active region 102A, wherein the thickness and material composition of the layer 108 may provide the desired adaptation of the electronic characteristics in order to obtain the desired threshold voltage for the transistor still to be formed in and above the active region 102A.

FIG. 1f schematically illustrates the device 100 in a further advanced manufacturing stage in which a further etch process 109 is performed on the basis of hydrofluoric acid in order to remove the mask layer 104 from the active region 102B. As discussed above, hydrofluoric acid is a very selective etch chemistry with respect to silicon-based materials, thereby substantially not attacking the materials in the active regions 102A, 102B. On the other hand, a further material loss may occur in the isolation region 102C, thereby in particular increasing the height difference between the active region 102A and the adjacent portion of the isolation structure 102C. Consequently, the further processing is based on a significant topography, in particular in the vicinity of the active region 102A.

FIG. 1g schematically illustrates the semiconductor device 100 in a further advanced manufacturing stage. As illustrated, a gate electrode structure 130A is formed on the active region 102A, i.e., on the threshold adjusting semiconductor layer 108, and a gate electrode structure 130B is formed on the active region 102B. The gate electrode structures 130A, 130B may basically have a similar configuration, for instance in view of critical dimension and material composition, except for any differences as required for adjusting a different work function and thus threshold voltage for transistors to be formed on the basis of the gate electrode structures 130A, 130B. For example, the gate electrode structure 130A may comprise a thin dielectric material 131, such as a silicon oxynitride material, in combination with a high-k dielectric material 132A and a metal-containing cap layer or electrode material 133A, such as titanium nitride and the like. Moreover, a further electrode material 134 in the form of a silicon material, a silicon/germanium material and the like is typically provided in combination with a dielectric cap layer 135, such as a silicon nitride material, a silicon dioxide material and the like. Similarly, the gate electrode structure 130B comprises the dielectric material 131 and a high-k dielectric material layer 132B in combination with a metal-containing electrode material 133B, followed by the semiconductor material 134 and the dielectric cap material 135. Depending on the process and device requirements, the high-k dielectric materials 132A, 132B and/or the metal-containing electrode materials 133A, 133B may differ, for instance with respect to the incorporation of the appropriate work function adjusting metal species, such as aluminum for P-channel transistors, lanthanum for N-channel transistors and the like.

As previously explained, generally, the patterning of gate electrode structures having a length of 50 nm and less requires sophisticated deposition processes, lithography and patterning strategies, which may be influenced by the local surface topography. In particular, the incorporation of additional material systems, such as the layer 132A, 133A and 132B, 133B, in addition to conventional material systems, such as the layers 131 and 134, may result in different layer thickness values above the active regions 102A, 102B due to the different local topography. Similarly, during the subsequent complex lithography and etch processes, a difference in local surface topography in combination with the previously induced non-uniformities may additionally contribute to a different process result, for instance in terms of a different critical dimension of the gate electrode structures 130A, 130B, the cross-sectional shape, in particular at the foot of the gate electrode structures 130A, 130B, and the like.

For example, the formation of the material 131 and subsequently the deposition of the high-k dielectric material for the layers 132A, 132B may require process strategies requiring a high degree of conformal deposition behavior in order to provide the desired final characteristics of a gate dielectric material composed of the layers 131 and 132A, 132B, respectively. Similarly, typically, work function adjusting species have to be provided on the basis of moderately thin metal layers, which may have to be patterned prior to the actual patterning of the gate electrode structures 130A, 130B, wherein the local different surface topography may also result in non-desired irregularities. Similarly, the deposition of the materials 133A, 133B may also be influenced by the surface topography. It should be appreciated that typically a plurality of process strategies are available for appropriately adjusting the work function and thus threshold voltage in the gate electrode structures 130A, 130B, such as sophisticated diffusion processes and the like, wherein any variation in layer thickness, for instance caused by the pronounced surface topography, may result in a corresponding variation of transistor characteristics.

FIG. 1h schematically illustrates the semiconductor device 100 in a further advanced manufacturing stage in which a liner material 136, such as a silicon nitride material, may be deposited with a thickness of several nanometers in order to confine sensitive material in the gate electrode structures 130A, 130B, such as the materials 132A, 133A, 132B, 133B. For example, a reliable coverage of sidewalls of these materials may also strongly depend on the previous process results upon patterning the gate electrode structures 130A, 130B so that the actual confinement by the layer 136 may also be different for the different gate electrode structures. Consequently, generally, an increased thickness of the layer 136 may have to be implemented in order to ensure a reliable confinement of each of the gate electrode structures 130A, 130B, which, however, on the other hand, may negatively influence the overall transistor characteristics.

FIG. 1i schematically illustrates the semiconductor device 100 in a further advanced manufacturing stage. As illustrated, a P-channel transistor 150A is formed in and above the active region 102A and comprises the gate electrode structure 130A. Similarly, a transistor 150B, such as an N-channel transistor, is formed in and above the active region 102B and comprises the gate electrode structure 130B. The transistors 150A, 150B comprise drain and source regions 152, for instance in combination with metal silicide regions 153 provided therein. Furthermore, metal silicide regions 137 may also be formed in the gate electrode structures 130A, 130B. Additionally, a spacer structure 151 may be formed on sidewalls of the gate electrode structures 130A, 130B, for instance on the liner 136, that is typically preserved throughout the entire process flow for confining the sensitive materials in the gate electrode structures 130A, 130B, as discussed above.

The transistors 150A, 150B as illustrated in FIG. 1i may be formed on the basis of any appropriate process strategy, wherein, starting from the configuration as shown in FIG. 1h, the liner 136 may be formed into spacer elements by any appropriate etch process, possibly in combination with the provision of any additional sidewall spacer elements, which may be accomplished by well-established etch strategies. If required, a strain-inducing semiconductor material may be provided in the active region 102A, for instance in the form of a silicon/germanium material and the like. Similarly, a silicon/carbon material may be incorporated in the active region 102B if a corresponding strain-inducing mechanism is required for the transistor 150B. Thereafter, the spacer structure 151 in combination with the drain and source regions 152 are provided on the basis of well-established masking regimes and implantation techniques, followed by anneal processes. Thereafter, the metal silicide regions 153 and 137 may be formed, wherein, at any appropriate manufacturing stage, the dielectric cap materials 135 (FIG. 1g) may have been removed in order to expose the semiconductor material 134 of the gate electrode structures 130A, 130B. Thereafter, the further processing may be continued by forming an interlayer dielectric material and providing contact elements therein so as to connect to the transistors 150A, 150B.

Thus, the above-described process strategy may represent a very promising approach for providing sophisticated transistors on the basis of high-k metal gate electrode structures, wherein, however, undue fluctuations in transistor characteristics may be observed, which may be strongly correlated to the pronounced surface topography in the isolation regions.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides techniques for forming complex gate electrode structures on the basis of a threshold adjusting semiconductor alloy, wherein transistor variability may be reduced by improving the surface topography of active regions, i.e., by reducing the difference in topography between isolation regions and the active regions of P-channel transistors and N-channel transistors. To this end, the process sequence for forming the threshold adjusting semiconductor alloy may be accomplished on the basis of a process sequence which provides a high degree of "symmetry" of active regions of P-channel transistors and N-channel transistors and the adjacent isolation regions in view of the exposure to reactive etch chemistries, which may result in a material loss in the isolation region. Consequently, by providing a more symmetric process flow in view of the material loss in the isolation region adjacent to P-channel transistors and N-channel transistors, any non-uniformities caused by a significant difference in surface topography, as is typically caused in the conventional process regime, may be reduced. In some illustrative aspects disclosed herein, an etch mask may be used for removing the growth mask from one active region after the threshold adjusting semiconductor material has been epitaxially grown on the other type of active region. In this manner, the material loss in the adjacent portions of the isolation region may be substantially identical for P-channel transistors and N-channel transistors, thereby significantly improving the uniformity of the subsequent fabrication of the sophisticated gate electrode structures.

One illustrative method disclosed herein comprises forming a mask layer on a first active region and a second active region of a semiconductor device. The method further comprises forming a first etch mask so as to cover the second active region and expose the first active region. Additionally, the mask layer is selectively removed from the first active region by using the first etch mask. The method additionally comprises forming a layer of a semiconductor alloy on the first active region and using the mask layer on the second active region as a growth mask. Furthermore, a second etch mask is formed so as to cover the first active region and expose the second active region. The method further comprises removing the mask layer from the second active region by using the second etch mask and forming a first gate electrode structure of a first transistor above the first active region and a second gate electrode structure of a second transistor above the second active region, wherein the first and second gate electrode structures comprise a metal-containing gate electrode material and a gate insulation layer comprising a high-k dielectric material.

A further illustrative method disclosed herein relates to forming a semiconductor device. The method comprises forming a silicon oxide layer on a first active region and a second active region. The method additionally comprises removing the silicon oxide layer selectively from above the first active region by using a first etch mask, which covers the second active region. Moreover, the method comprises forming a threshold adjusting semiconductor material in the first active region and using the silicon oxide layer formed on the second active region as a deposition mask. The method further comprises removing the silicon oxide layer from above the second active region by using a second etch mask, which covers the first active region that includes the threshold adjusting semiconductor material.

A still further illustrative method disclosed herein comprises forming a mask layer above a first active region and a second active region of a semiconductor device, wherein the first and second active regions are laterally delineated by an isolation region. The method further comprises removing the mask layer from the first active region by establishing a first reactive process atmosphere selectively above the first active region and a first portion of the isolation region. The method further comprises forming a layer of a semiconductor alloy selectively in the first active region. The method additionally comprises removing the mask layer from the second active region by establishing a second reactive process atmosphere selectively above the second active region and a second portion of the isolation region, wherein the first and second reactive process atmospheres are established on the basis of the same process parameters and reactive materials. Moreover, the method comprises forming a first gate electrode structure of a first transistor on the layer of a semiconductor alloy and a second gate electrode structure of a second transistor on the second active region, wherein the first and second gate electrode structures comprise a metal-containing gate electrode material and a gate insulation layer comprising a high-k dielectric material.

BRIEF DESCRIPTION OF THE DRAWINGS

The disclosure may be understood by reference to the following description taken in conjunction with the accompanying drawings, in which like reference numerals identify like elements, and in which.

Figure 1A:
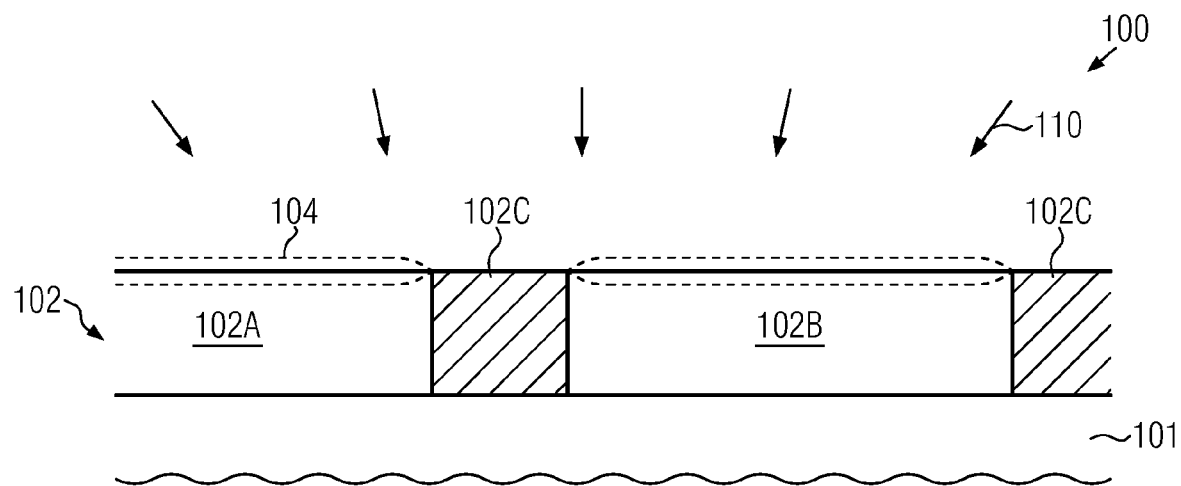
FIGS. 1a-1i schematically illustrate cross-sectional views of a semiconductor device during a complex manufacturing process for forming high-k metal gate electrode structures in an early manufacturing stage.
Figure 1B:
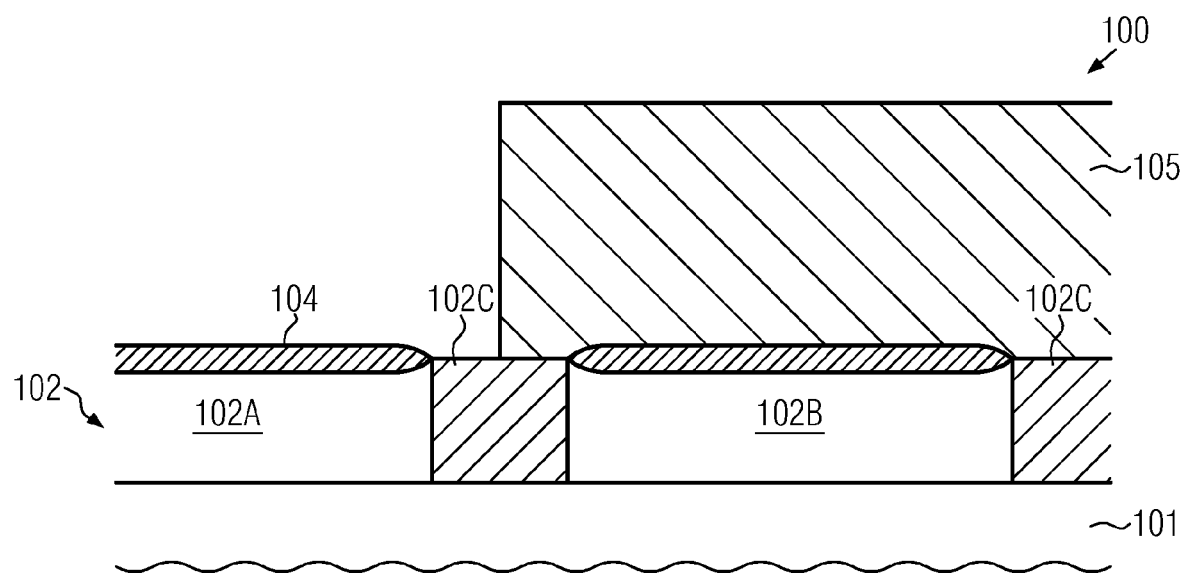
Figure 1C:
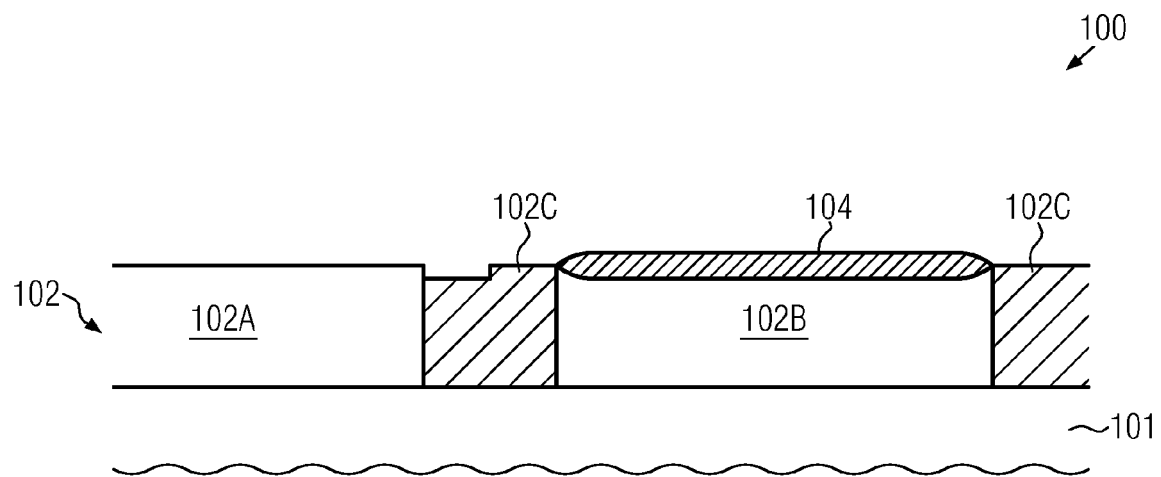
Figure 1D:
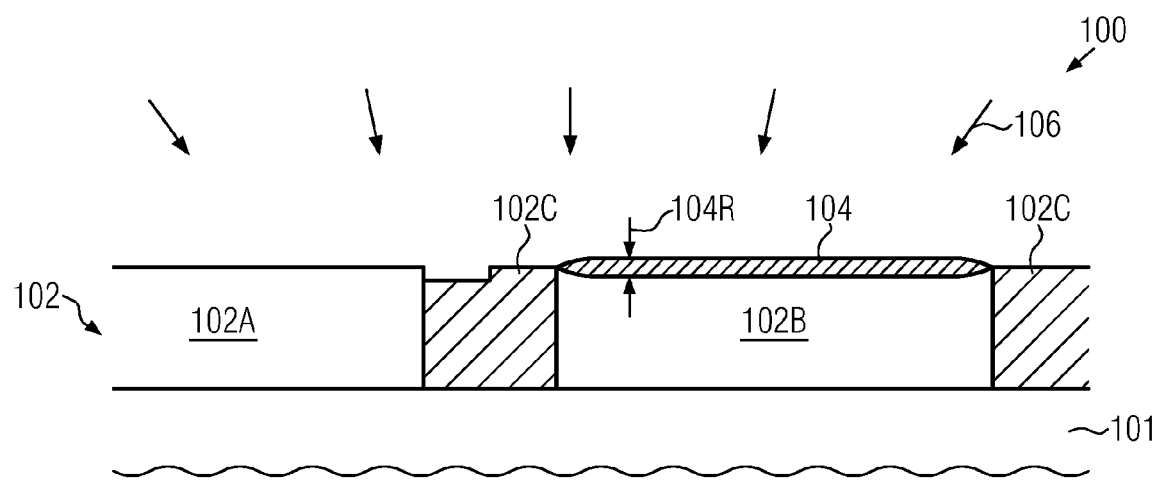
Figure 1E:
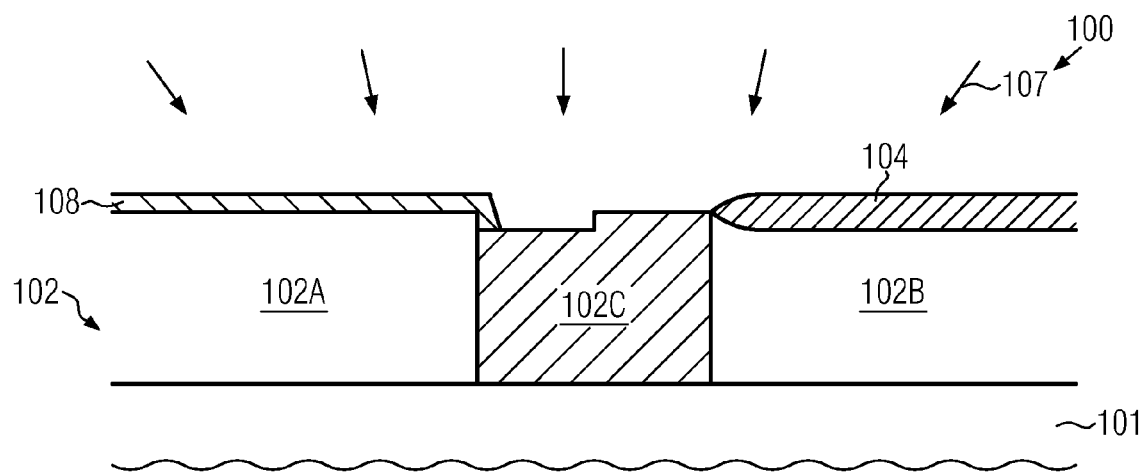
Figure 1F:
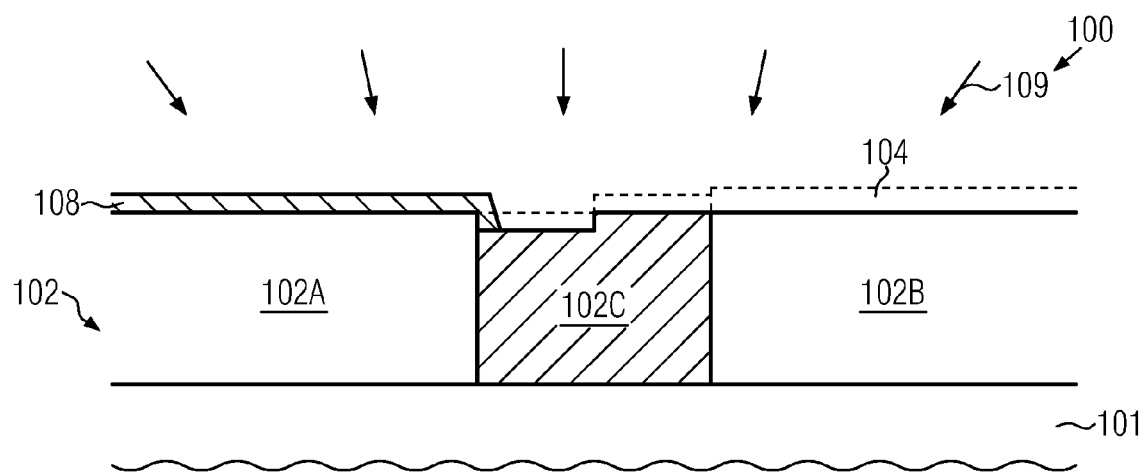
Figure 1G:
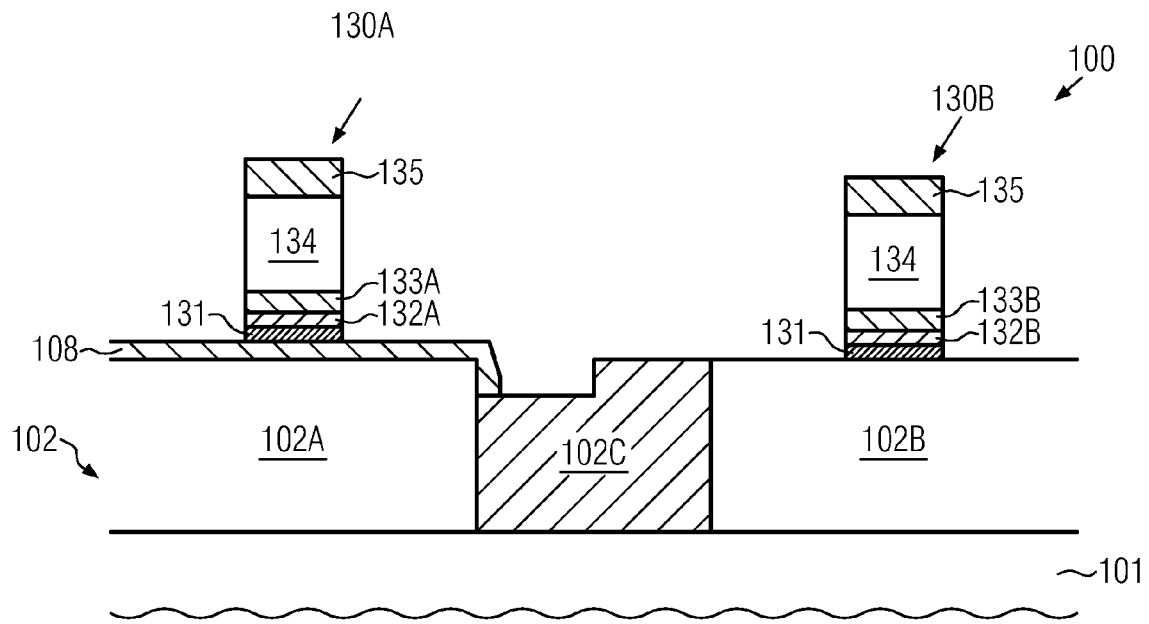
Figure 1H:
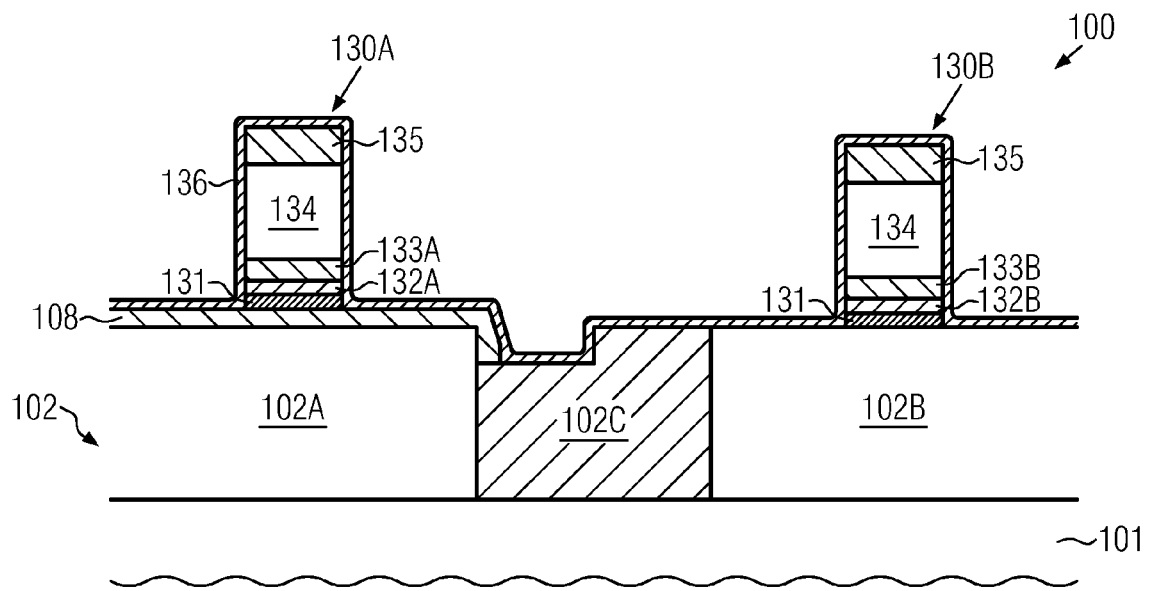
Figure 1I:
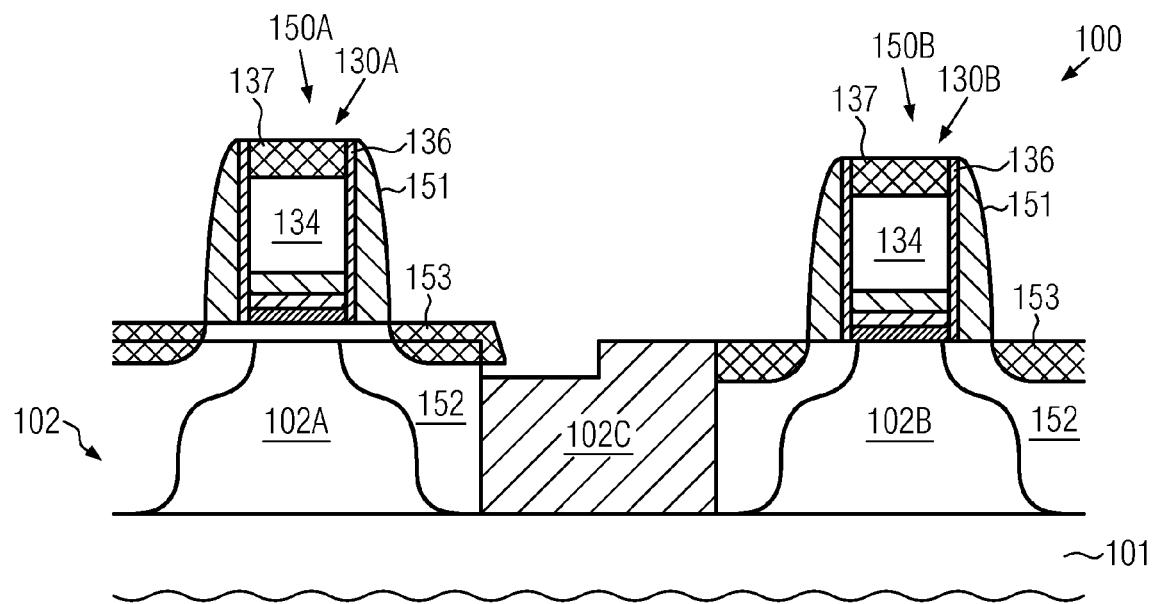

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides manufacturing techniques in which high-k metal gate electrode structures may be formed in an early manufacturing stage on the basis of a threshold adjusting semiconductor material, such as a silicon/germanium material, which is to be formed selectively in one type of active region. During the process sequence, prior to actually patterning the sophisticated gate electrode structures, the material loss in an isolation region may be controlled such that there may be a superior uniformity and surface topography compared to conventional strategies, as described above. To this end, the portion of the isolation region adjacent to the active region receiving the threshold adjusting semiconductor material and the portion of the isolation region adjacent to the other type of active region may be treated such that substantially the same process history with respect to reactive processes may be established, in which a material loss may be caused in the isolation region. For example, the process flow may be implemented in such a manner that the exposure to hydrofluoric acid may be substantially the same in the vicinity of the different types of active regions. Consequently, the conditions in the active regions for patterning the gate electrode structures for P-channel transistors and N-channel transistors may be similar and may thus result in less pronounced non-uniformities during the further processing.

In some illustrative embodiments disclosed herein, an etch mask may be provided for removing the mask layer in one of the active regions after the deposition of the threshold adjusting semiconductor material, thereby establishing a certain degree of "symmetry" with respect to any processes in which a material loss in exposed portions of the isolation regions may occur. In other illustrative embodiments, generally, a superior surface topography may be accomplished by appropriately recessing the active region that receives the threshold adjusting semiconductor material, thereby further contributing to an overall superior surface topography upon patterning the gate electrode structures. In still other illustrative embodiments, a silicon oxide-based material may be formed on the basis of a deposition process, thereby generally providing a superior surface topography in combination with an additional etch mask. Generally, in this case, a recessing may be performed in one or both of the active regions in order to provide an even further enhanced surface topography.

With reference to FIGS. 2a-2i, further illustrative embodiments will now be described in more detail, wherein reference is also made to FIGS. 1a-1i, in particular when referring to process strategies for actually patterning the gate electrode structures and the transistor elements on the basis of a threshold adjusting semiconductor material that is selectively provided in one type of active region.

Figure 2A:
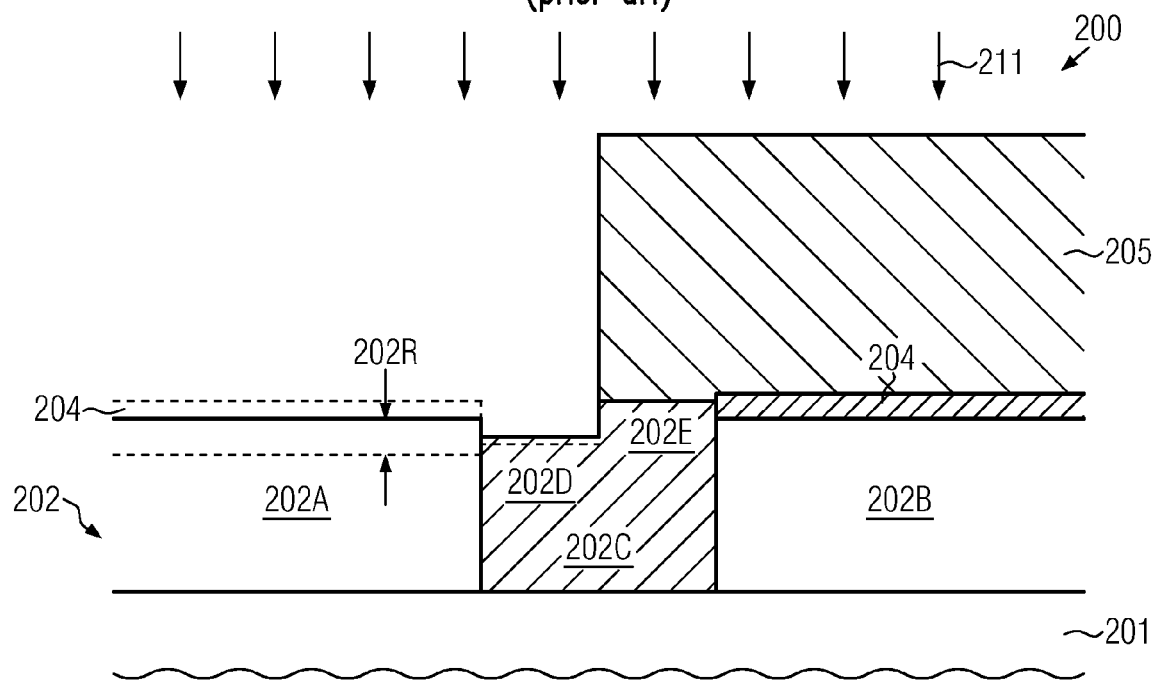
FIGS. 2a-2e schematically illustrate cross-sectional views of a semiconductor device in an early manufacturing stage for providing a threshold adjusting semiconductor alloy selectively in an active region of a P-channel transistor with superior symmetry in view of a material loss in the isolation region, according to illustrative embodiments.

FIG. 2a schematically illustrates a cross-sectional view of a semiconductor device 200 comprising a substrate 201 and a semiconductor layer 202 in which are formed active regions 202A, 202B, which are laterally delineated by an isolation region 202C. The semiconductor layer 202 and the substrate 201, as well as the active regions 202A, 202B and the isolation region 202C, may have a similar configuration as is previously described with reference to the semiconductor device 100. For example, the active region 202A may represent the active region in which a semiconductor material is to be formed so as to adjust a desired band gap offset, for instance for a P-channel transistor and the like, as is also previously explained. On the other hand, the active region 202B represents a semiconductor region in which the deposition of a corresponding threshold adjusting semiconductor alloy is not required. For example, as is also previously discussed, the active region 202A may correspond to a P-channel transistor and the active region 202B may correspond to an N-channel transistor. It should be appreciated that the isolation region 202C may have an appropriate configuration so as to laterally delineate any active regions in the layer 202, wherein not necessarily the active regions 202A, 202B may have to be positioned in close proximity to each other. Irrespective of the actual lateral dimension of the isolation region 202C, it may comprise a first portion 202D positioned adjacent to the active region 202A and a second portion 202E positioned adjacent to the active region 202B.

The active regions 202A, 202B and the isolation structure 202C may initially be formed on the basis of process techniques as are also described above with reference to the device 100. Similarly, a mask layer 204, such as a silicon oxide material, may be formed on the active regions 202A, 202B, for instance on the basis of an oxidation process, as is described above, while, in other cases, a deposition process may be used, as will be described later on in more detail. Furthermore, an etch mask 205, such as a resist mask, may be formed so as to cover the active region 202B, i.e., the mask layer 204 formed thereon, and the second portion 202E of the isolation region 202C. On the other hand, the mask 205 may expose the active region 202A, i.e., the mask layer 204 formed thereon, and may also expose the first portion 202D of the isolation region 202C. On the basis of the etch mask 205, an etch process 211 may be performed, for instance on the basis of hydrofluoric acid, as is also discussed above. Consequently, the mask 204 may be removed from above the active region 202A, thereby also causing a certain material loss in the first portion 202D. Thereafter, the etch mask 205 may be removed on the basis of any well-established wet chemical etch recipe and the like, and the further process may be continued, for instance by cleaning the exposed surface areas and the like, as is also previously described with reference to the semiconductor device 100. For example, as discussed above, a cleaning process may be performed which may result in a certain material loss in the layer 204 and also in the isolation region 202C in order to prepare the device 200 for a subsequent selective epitaxial growth process.

In other illustrative embodiments, the reactive process 211 shown in FIG. 2a may be associated with a further etch process in order to form a recess 202R in the active region 202A after the removal of the exposed portion of the mask layer 204. To this end, selective etch recipes may be applied in which silicon material may be etched selectively with respect to silicon dioxide and the like. It should be appreciated that a corresponding etch process may be performed on the basis of the mask 205 while, in other cases, the mask 205 may be removed, depending on the overall process strategy. The recess 202R may be selected in view of a desired layer thickness of a threshold adjusting semiconductor material that has to be formed in the subsequent selective epitaxial growth process. It should be appreciated that a plurality of etch recipes are available for removing silicon material in a highly controllable manner.

Figure 2B:
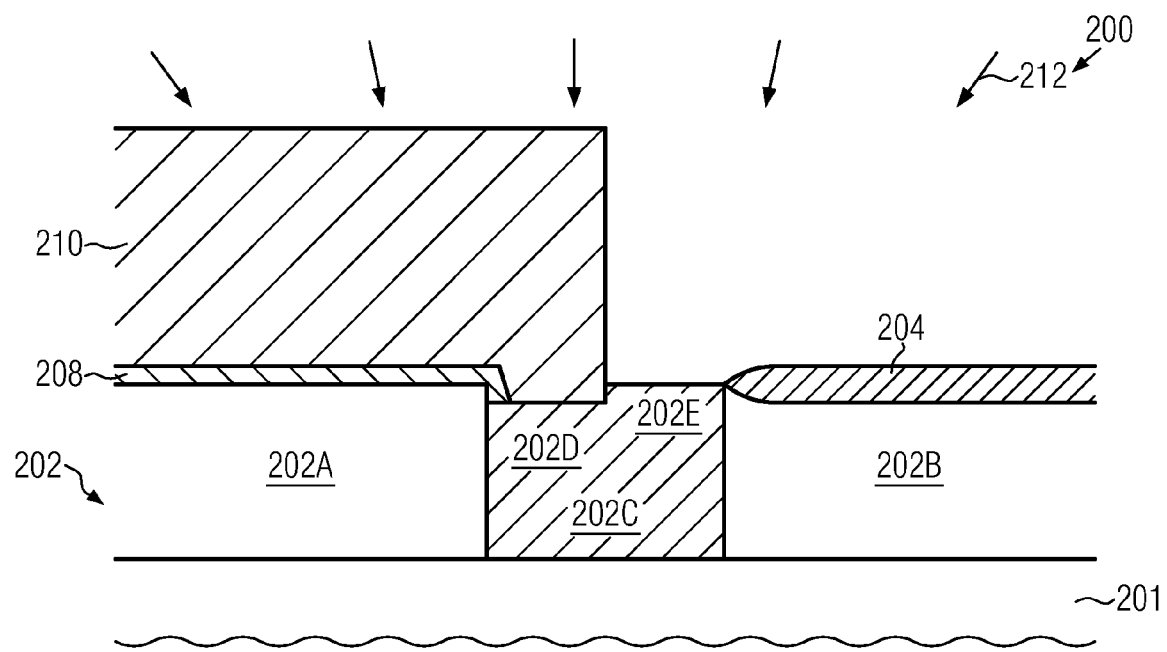

FIG. 2b schematically illustrates the semiconductor device 200 in a further advanced manufacturing stage. As illustrated, a semiconductor material 208, also referred to as a threshold adjusting semiconductor material, may be formed on the active region 202A and may now represent a portion thereof. The semiconductor material 208 may have any appropriate thickness and material composition in order to obtain the desired band gap offset, as is also discussed above. The material 208 may be formed on the basis of a selective epitaxial growth process, as is also discussed above in the context of the semiconductor device 100, while the mask layer 204 may act as an efficient growth mask. Furthermore, in the manufacturing stage shown, the mask layer 204 is to be removed from the active region 202B on the basis of an etch process 212, for instance performed on the basis of hydrofluoric acid, wherein, contrary to conventional strategies, an etch mask 210 may be applied so as to cover the active region 202A. The etch mask 210 may be formed on the basis of a lithography step in which a lithography mask may be used that is "inverse" with respect to a lithography mask during the formation of the etch mask 205 in FIG. 2a. That is, a corresponding lithography mask may be provided on the basis of inverse image data compared to the lithography mask previously used and may thus be produced without undue complexity. Furthermore, due to the inverse configuration of the masks 210 and 205 (FIG. 2a), the portion 202D may also be covered by the mask 210, while the portion 202E may be exposed to the reactive process atmosphere 212, thereby providing a certain degree of symmetry with respect to the exposure of the isolation region 202C to any reactive process atmosphere in which a material loss in the isolation region 202C may be generated.

Figure 2C:
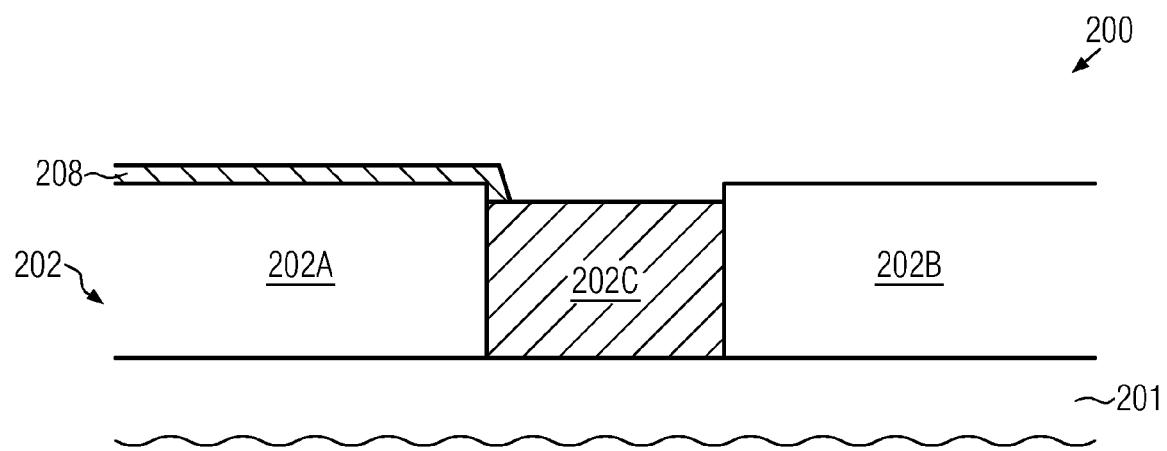

FIG. 2c schematically illustrates the semiconductor device 200 in a manufacturing stage after the removal of the etch mask 210 of FIG. 2b. Consequently, the isolation region 202C may have a superior surface topography compared to conventional strategies due to essentially the same "process history"

in view of any reactive process atmospheres for removing the mask layer 204 (FIG. 2a). That is, the mask layer 204 has been removed during different process stages, however, on the basis of similar process conditions, i.e., the etch processes 211, 212 and the etch masks 205, 210 (FIGS. 2a, 2b). In some illustrative embodiments, the corresponding reactive process atmospheres may be established on the basis of the same process parameters and reactive components, thereby providing a superior degree of symmetry. In this case, the processes 211 and 212 may represent essentially identical processes, wherein additional processes may also be implemented, if desired. For example, as discussed above with reference to FIG. 2a, an additional etch process may be implemented in order to form the recess 202R, as shown in FIG. 2a. In this case, the process 212 may also be associated with a corresponding recessing process, which may thus expose the isolation region 202C in total to substantially the same reactive process atmospheres. Based on the device configuration as shown in FIG. 2c, the processing may be continued by forming gate electrode structures wherein similar process strategies may be applied, as previously described with reference to FIGS. 1g and 1h, wherein, however, due to the superior topography of the isolation region 202C, any process-related non-uniformities may be significantly reduced. Consequently, transistors may be provided in and above the active regions 202A, 202B, such as transistors as previously described with reference to FIG. 1i in the form of the transistors 150A, 150B, which may have sophisticated high-k metal gate electrode structures, wherein the overall transistor variability may be reduced due to superior uniformity of critical dimensions, cross-sectional shape, material composition, degree of confinement and the like, as is also discussed above.

Figure 2D:
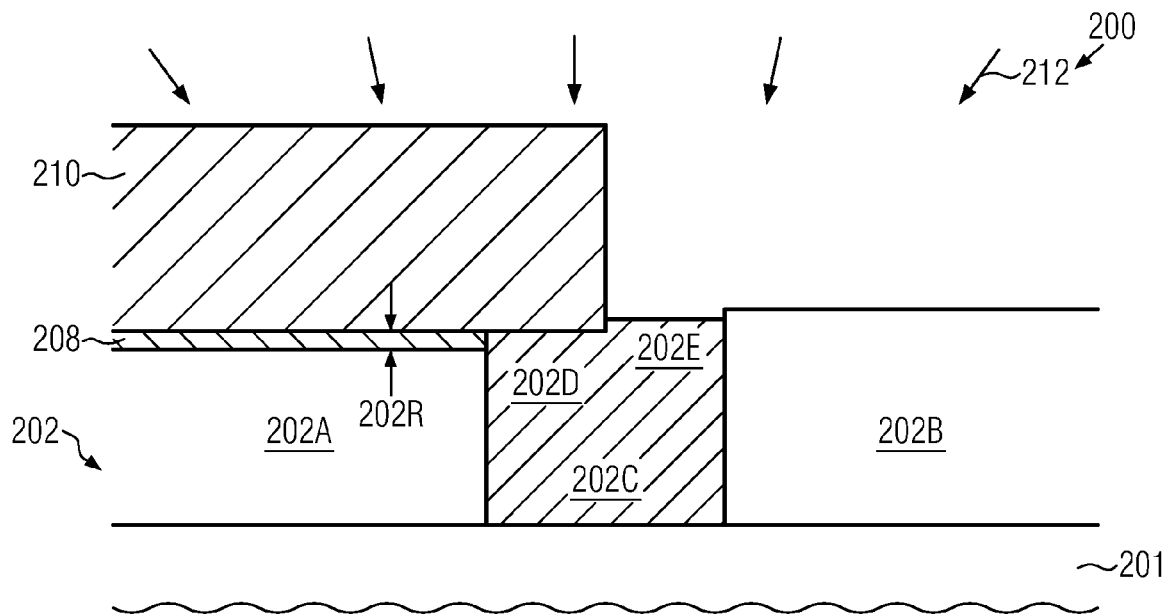

FIG. 2d schematically illustrates the semiconductor device 200 according to illustrative embodiments in which the recess 202R has been formed in an earlier manufacturing stage, as is also explained above. Consequently, the layer 208 may be formed within the recess 202R, thereby providing a superior topography of the active region 202A and the adjacent portion 202D of the isolation region 202C. Also in this case, the cap layer (see FIG. 2b) may be efficiently removed from the active region 202B on the basis of the etch process 212 and the mask 210. Since the recess 202R may have been formed on the basis of the etch mask 205, the portion 202D may have been exposed to a certain reactive process atmosphere, which may cause a certain degree of material removal, although significantly less compared to the removal in the active region 202A in order to form the recess 202R. In this case, a similar process atmosphere may be established on the basis of the etch mask 210 in order to provide a high degree of symmetry with respect to the portions 202D and 202E.

Figure 2E:
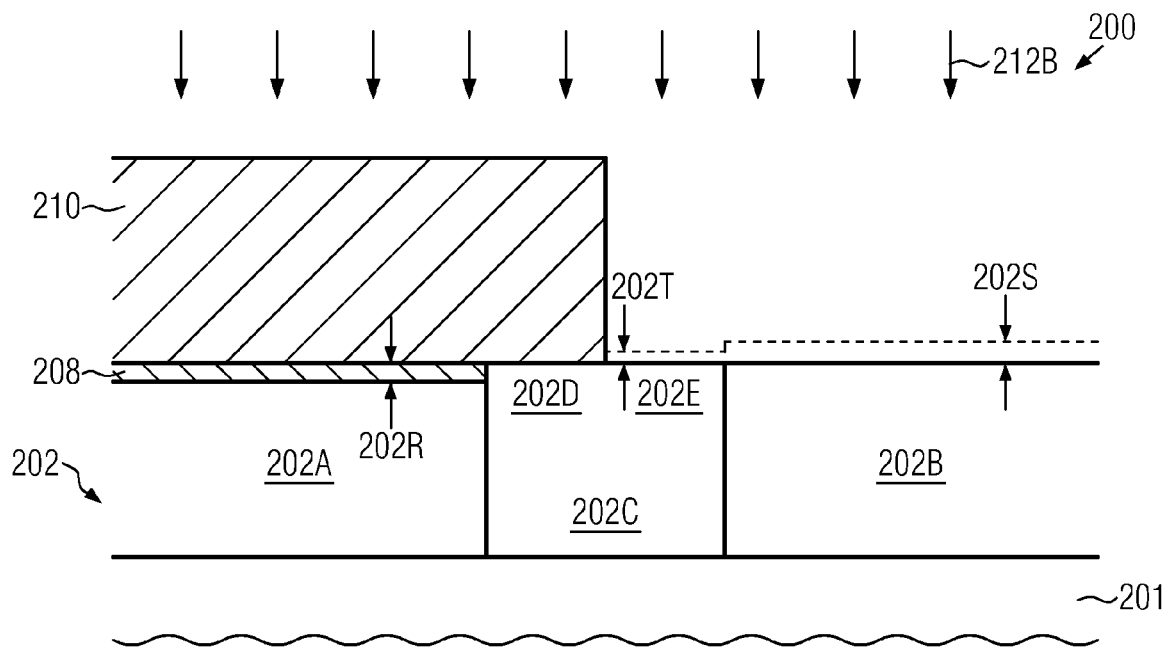

FIG. 2e schematically illustrates the semiconductor device 200 when exposed to a further reactive process atmosphere 212B, in which, for instance, the same process parameters and reactive components may be applied as have previously been used when forming the recess 202R in the active region 202A. It should be appreciated that a certain degree of recessing 202S may thus be generated in the active region 202B, while also a certain degree of recessing 202T in the exposed portion 202E may occur, depending on the degree of selectivity between the silicon material of the active region 202B and the silicon oxide material in the isolation region 202C during the etch process 212B. It should be appreciated that the process 212B may be performed with a reduced process time since, generally, the degree of recessing 202S may be less in order to obtain a planar surface topography compared to the recess 202R in which additionally the thickness of the layer 208 may have been taken into consideration. Nevertheless, an improved surface topography may be obtained, while superior symmetry with respect to the exposure of any reactive process atmospheres may also be achieved.

Thereafter, the further processing may be continued, as is also described above and is also discussed with reference to the semiconductor device 100. In this case, an even further reduced degree of non-uniformities may be generated due to the superior surface topography obtained by the recess 202R, possibly in combination with the recess 202S.

Figure 2F:
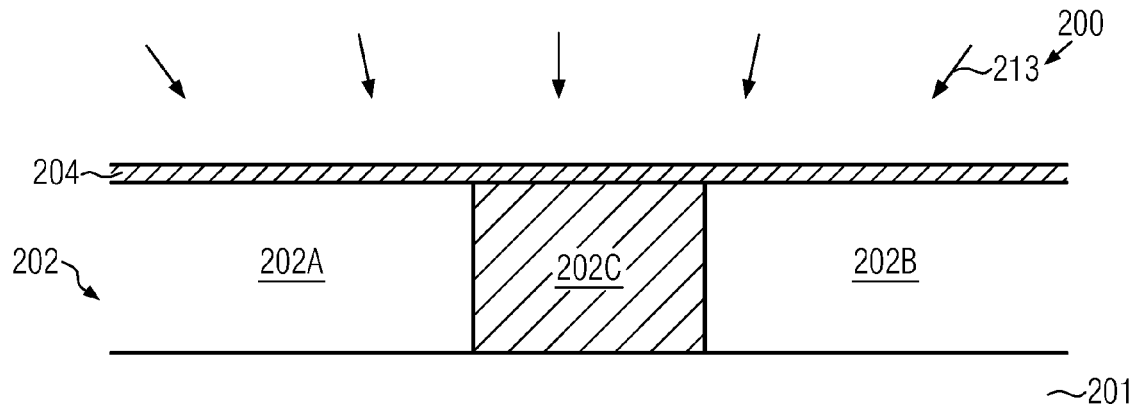
FIGS. 2f-2i schematically illustrate cross-sectional views of the semiconductor device during various manufacturing stages, wherein a mask layer for providing a threshold adjusting semiconductor alloy may be formed on the basis of a deposition process, according to still further illustrative embodiments.

FIG. 2f schematically illustrates the semiconductor device 200 according to further illustrative embodiments in which the mask layer 204 may be formed above the active regions 202A, 202B on the basis of a deposition process 213. Consequently, in this case, the layer 204 is also formed above the isolation region 202C. The deposition process 213 may be performed on the basis of any appropriate deposition recipe, such as plasma enhanced CVD, thermally activated CVD and the like. If required, an anneal process may be performed after the deposition process 213, for instance on the basis of temperatures of approximately 700-1100° C. in order to densify the material of the layer 204, thereby achieving a superior masking effect.

Figure 2G:
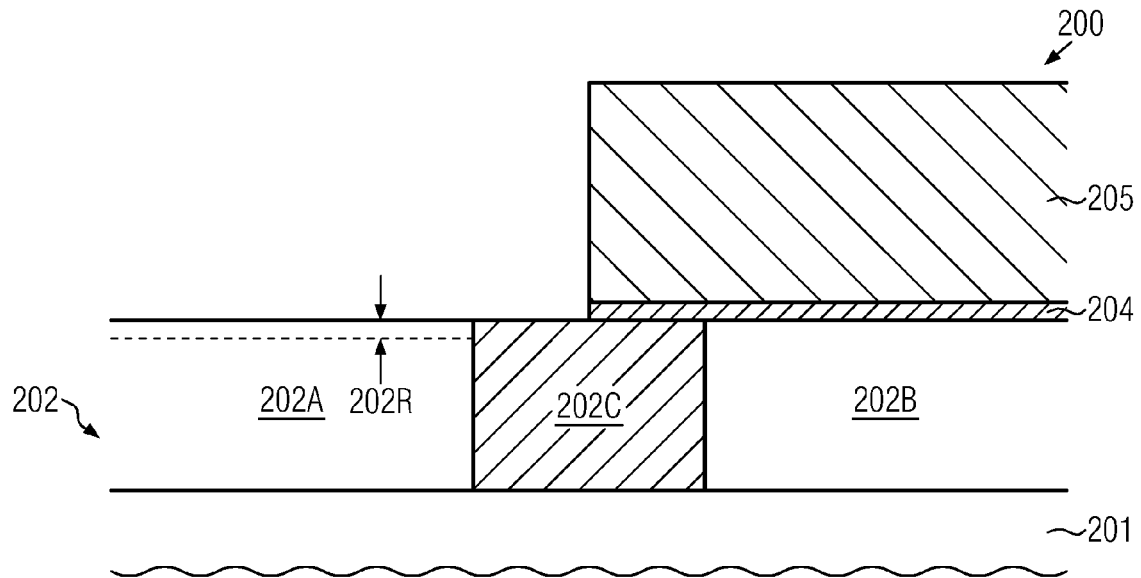

FIG. 2g schematically illustrates the device 200 in a further advanced manufacturing stage in which the mask layer 204 may be removed on the basis of the etch mask 205, for instance by using hydrofluoric acid, as is also discussed above. Due to the presence of the mask layer 204 on the isolation region 202C, a corresponding material loss may be significantly reduced compared to process strategies in which the mask layer 204 may be provided on the basis of an oxidation process. Furthermore, in some illustrative embodiments, a recess 202R may be generated on the basis of any appropriate process strategy, as described above.

Figure 2H:
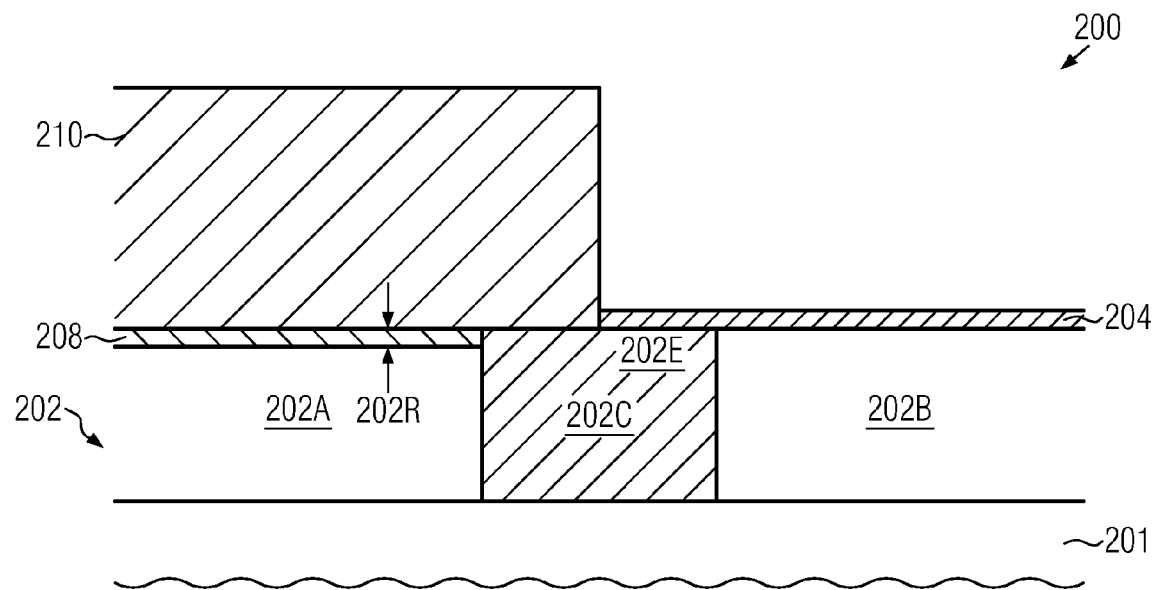

FIG. 2h schematically illustrates the device 200 in a further advanced manufacturing stage. As illustrated, the threshold adjusting semiconductor material 208 may be formed on the active region 202A, possibly in the recess 202R, if provided, as is shown in FIG. 2h. In other cases, without providing the recess 202R, the material 208 may be formed on the active region 202A, as is also previously described. On the other hand, the active region 202B and the portion 202E may still be covered by the mask layer 204. On the basis of the etch mask 210, the mask layer 204 may be removed, which may be accomplished on the basis of the same process conditions as previously applied when removing the mask layer 204 from above the first active region 202A. Consequently, a pronounced material loss in the portion 202E of the isolation region 202C may also be avoided during the corresponding etch process, thereby in total providing a superior surface topography.

Figure 2I:
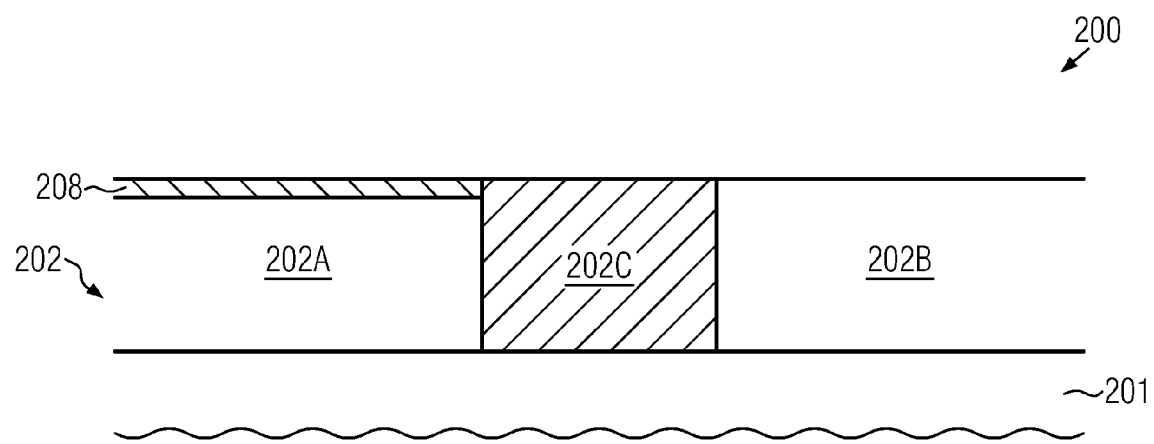

FIG. 2i schematically illustrates the semiconductor device 200 after the removal of the etch mask 210 (FIG. 2h). Thus, the further processing may be continued on the basis of superior surface conditions, which may thus result in superior uniformity of the resulting high-k metal gate electrode structures, as is also described above. Consequently, gate electrode structures, such as the gate electrode structures 130A, 130B of transistors 150A, 150B (FIGS. 1g-1i) may be provided on the basis of process techniques, as are also described with reference to the device 100.

As a result, the present disclosure provides manufacturing techniques in which superior uniformity of transistors may be achieved by providing a superior surface topography prior to actually patterning the high-k metal gate electrode structures. To this end, in some embodiments, an etch mask may be provided so as to remove the mask layer used for protecting one type of active regions during the selective epitaxial growth of a threshold adjusting semiconductor material, thereby achieving a substantial symmetric exposure to reactive etch atmospheres, which in turn may result in a generally reduced and more symmetric material loss in the isolation region. Hence, superior uniformity during the subsequent patterning of the high-k metal gate electrode structures may be achieved.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a mask layer on a first active region and a second active region of a semiconductor device;
    forming a first etch mask so as to cover said second active region and expose said first active region;
    removing said mask layer selectively from said first active region by using said first etch mask;
    forming a recess in said first active region in the presence of said first etch mask;
    after forming said recess in said first active region, forming a layer of a semiconductor alloy on said first active region and using said mask layer on said second active region as a growth mask;
    forming a second etch mask so as to cover said first active region and expose said mask layer on said second active region;
    removing said mask layer from said second active region by using said second etch mask;
    after removing said mask layer from said second active region, recessing said second active region in the presence of said second etch mask; and
    after forming said recess in said first active region and after recessing said second active region, forming a first gate electrode structure of a first transistor above said first active region and a second gate electrode structure of a second transistor above said second active region, said first and second gate electrode structures comprising a metal-containing gate electrode material and a gate insulation layer comprising a high-k dielectric material.

2. The method of claim 1, wherein forming said mask layer comprises forming a silicon and oxygen containing layer.

3. The method of claim 2, wherein said mask layer is formed by performing a deposition process.

4. The method of claim 3, further comprising annealing said mask layer at a temperature of approximately 900-1100° C.

5. The method of claim 2, wherein forming said mask layer comprises performing an oxidation process.

6. The method of claim 1, wherein removing said mask layer from said first and second active regions comprises performing a wet chemical etch process on the basis of hydrofluoric acid (HF).

7. The method of claim 1, wherein forming said first etch mask comprises forming said first etch mask so as to expose a first portion of an isolation region that laterally delineates said first active region and wherein said first etch mask is formed so as to cover a second portion of said isolation region that laterally delineates said second active region.

8. A method of forming a semiconductor device, the method comprising:
    forming a silicon oxide layer on a first active region and a second active region;
    removing said silicon oxide layer selectively from above said first active region by using a first etch mask, said first etch mask covering said second active region;
    forming a recess in said first active region in the presence of said first etch mask;
    after forming said recess in said first active region, forming a threshold adjusting semiconductor material in said first active region and using said silicon oxide layer formed on said second active region as a deposition mask;
    removing said silicon oxide layer from above said second active region by using a second etch mask, said second etch mask covering said first active region including said threshold adjusting semiconductor material;
    after removing said silicon oxide layer from said second active region, recessing said second active region in the presence of said second etch mask; and
    after forming said recess in said first active region and after recessing said second active region, forming a first gate electrode structure of a first transistor on said first active region including said threshold adjusting semiconductor material and a second gate electrode structure of a second transistor on said second active region.

9. The method of claim 8, wherein forming said first and second gate electrode structures comprises forming a high-k dielectric material above said threshold adjusting semiconductor material and said second active region and forming a metal-containing electrode material above said high-k dielectric material.

10. The method of claim 9, wherein said high-k dielectric material and said metal-containing electrode material are formed prior to forming drain and source regions in said first and second active regions.

11. The method of claim 8, wherein forming said silicon oxide layer comprises performing at least one of an oxidation process and a deposition process.

12. The method of claim 8, wherein said threshold adjusting semiconductor material comprises a silicon/germanium alloy.

13. A method, comprising:
    forming a mask layer on a first active region and a second active region of a semiconductor device, said first and second active regions being laterally delineated by an isolation region;
    removing said mask layer from said first active region by establishing a first reactive process atmosphere selectively above said first active region and a first portion of said isolation region;
    forming a recess in said first active region;
    after forming said recess in said first active region, forming a layer of a semiconductor alloy selectively on said first active region;
    forming an etch mask so as to cover said first active region and expose at least said mask layer on said second active region;
    removing said mask layer from said second active region by establishing a second reactive process atmosphere selectively above said second active region and a second portion of said isolation region, said first and second reactive process atmospheres being established on the basis of the same process parameters and reactive materials;

after removing said mask layer from said second active region, recessing said second active region; and after forming said recess in said first active region and after recessing said second active region, forming a first gate electrode structure of a first transistor on said layer of a semiconductor alloy and a second gate electrode structure of a second transistor on said second active region, said first and second gate electrode structures comprising a metal-containing gate electrode material and a gate insulation layer comprising a high-k dielectric material.

14. The method of claim 13, wherein forming said mask layer comprises forming a silicon oxide layer by performing at least one of an oxidation process and a deposition process.

15. The method of claim 13, wherein establishing said first and second reactive process atmospheres comprises applying hydrofluoric acid (HF).

16. The method of claim 13, wherein establishing said first and second reactive process atmospheres comprises using a silicon etching agent.

* * * * *